United States Patent [19]

Kakigi

[11] 4,161,695

[45] Jul. 17, 1979

[54] TRANSMISSION AND RECEPTION CONTROL CIRCUIT FOR A TRANSCEIVER

[75] Inventor: Takao Kakigi, Inagi, Japan

[73] Assignee: Cybernet Electronic Corporation, Kanagawa, Japan

[21] Appl. No.: 796,423

[22] Filed: May 12, 1977

[30] Foreign Application Priority Data

May 14, 1976 [JP] Japan .................. 51/55174
Jul. 10, 1976 [JP] Japan .................. 51/82423

[51] Int. Cl.$^2$ ............................. H04B 1/40
[52] U.S. Cl. ........................... 325/17; 325/25
[58] Field of Search ............... 325/15, 17, 18, 19, 325/20, 21, 25, 22

[56] References Cited

U.S. PATENT DOCUMENTS

| 3,543,053 | 11/1970 | Mustain | 325/22 |
| 3,887,872 | 6/1975 | Sharpe | 325/22 |
| 3,971,985 | 7/1976 | Arai | 325/21 |
| 3,983,484 | 9/1976 | Hodama | 325/20 |
| 4,002,995 | 1/1977 | Reed | 325/25 |
| 4,061,973 | 12/1977 | Reimers et al. | 325/17 |
| 4,065,720 | 12/1977 | Pogue | 325/25 |

Primary Examiner—Robert L. Griffin
Assistant Examiner—Michael A. Masinick
Attorney, Agent, or Firm—Oblon, Fisher, Spivak, McClelland & Maier

[57] ABSTRACT

A transmission and reception control circuit for a transceiver adapted to compare the output frequency of a fixed frequency divider with that of a variable frequency divider thereby to automatically control the output frequency of a voltage-controlled oscillator, in which the output of a phase detector is compared with any of the output of a code converter, that of a channel-selection code generator and that of a press-to-talk switch singly or in combination thereby to control the operation of the transmitting and receiving stages.

8 Claims, 15 Drawing Figures

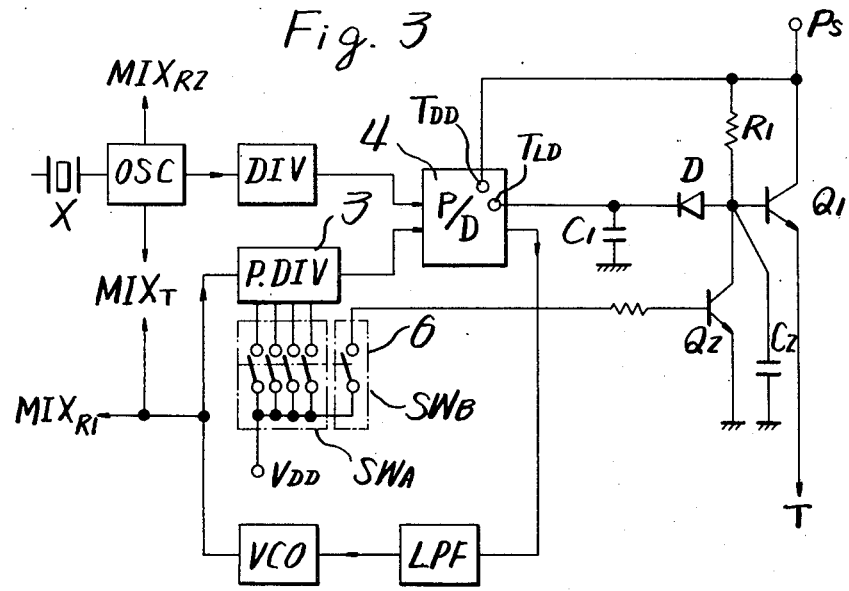
Fig. 3
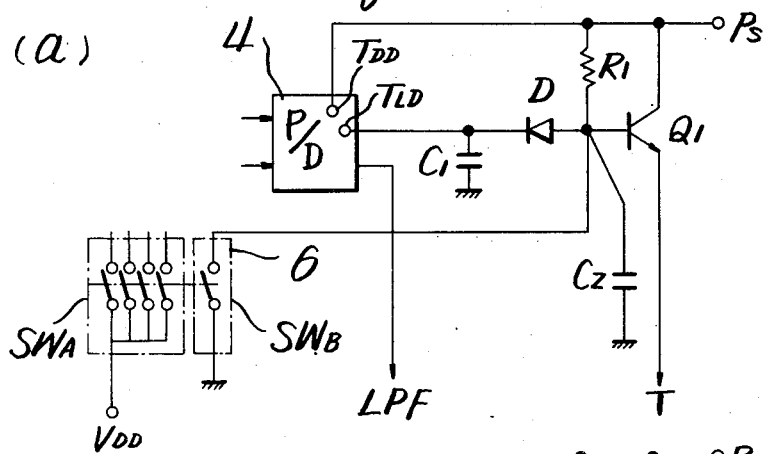
Fig. 4 (a)
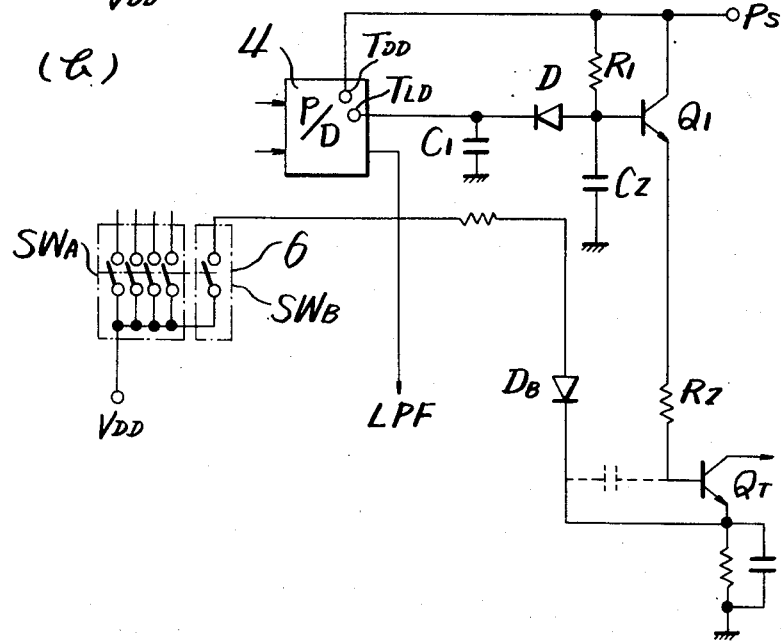
(b)

TRANSMISSION AND RECEPTION CONTROL CIRCUIT FOR A TRANSCEIVER

BRIEF SUMMARY OF THE INVENTION

The present invention relates to a transmission and reception control circuit of the phase locked loop (PLL) type for a transceiver.

It is the main object of the present invention to provide a transmission and reception control circuit for a transceiver which can control transmission and reception by mixing the output of the phase detector with any of the output of the code convertor, that of the channel selection code generator and that of the press-to-talk switch singly or in combination.

BRIEF DESCRIPTION OF THE DRAWINGS

FIG. 3 is a circuit diagram showing the second embodiment of the present invention;

FIGS. 4(a) and 4(b) show examples of the essential part of the circuit according to the present invention;

DETAILED DESCRIPTION

Figure 1:
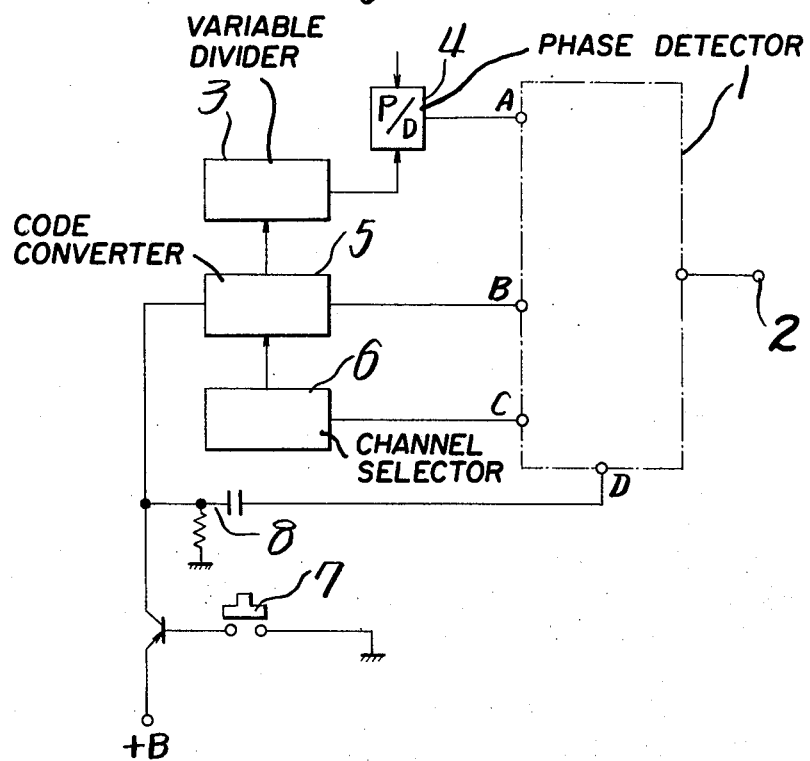
FIG. 1 is a block diagram showing the outline of the present invention.

First the outline of the present invention will be hereinafter described with reference to FIG. 1.

Reference numeral 1 designates a comparison gate circuit provided with an output terminal 2 for transmission and reception control and, in addition, with four input terminals A, B, C and D. Terminal A is connected to a phase detector 4 to which a variable frequency divider 3 is connected to form a phase locked loop (PLL). Terminal B is connected to a code converter 5, Terminal C to a channel selection code generator 6, and Terminal D to a pulse-generating means 8 which generates a "1 pulse" by the operation of a press-to-talk switch 7. The comparison gate circuit is so formed that an "impossible to send" or "impossible to receive" signal may appear on the output terminal 2 when an inhibiting signal is inputted to any of the terminals A, B, C and D depending upon the combinations "A and B," "A and C," "A, B and C," "A, B and D," "A, C and D," and "A, B, C and D." Hereinafter described will be how the transmitting and receiving functions are controlled according to the combinations of the terminals "A and B," "A and C," and "A and D."

Figure 2:
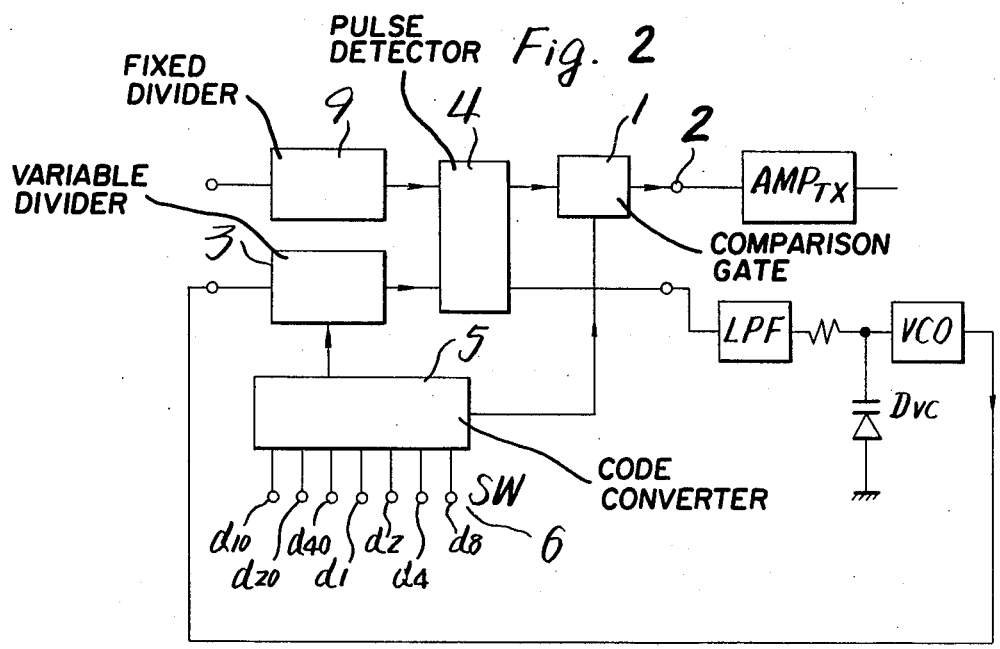
FIG. 2 is a block diagram showing the first embodiment of the present invention.

The following description with reference to FIGS. 1 and 2 is concerned with the first embodiment according to the present invention.

Generally, the communication equipment such as transceivers intended both to transmit and receive information performs channel selection for tansmission or reception by operating the selector switch. As is well known, the authorities designate frequencies or frequency bands that can be used and that cannot be used, and thereby prohibit transmission of disturbance or jamming waves. Actually the channel can be selected with the forbidden frequency band included, and therefore it is necessary to provide means for prohibiting transmission during channel selection.

The PLL type frequency synthesizer is so formed that a fixed frequency divider 9 receives a reference oscillation frequency, that a variable frequency divider 3 receives the output frequency of a voltage-controlled oscillator VCO, that the divided frequencies outputted from the fixed and variable frequency dividers 9 and 3 are supplied to a phase detector 4 for comparison, that the difference between the above two divided frequencies is fed back as a voltage signal to the voltage-controlled oscillator VCO through a low-pass filter LPF, and thereby that the output frequency of the voltage-controlled oscillator VCO may be automatically controlled. The above variable frequency divider 3 is so made that its divided frequency may be changed by selective switching of a changeover switch SW for controlling a code converter 5 for channel selection. The change-over switch SW is provided with a plurality of change-over contacts 6 for each digit of the channel number so that channel selection signals may be inputted to the code converter 5; for instance, the changeover contacts 6 may be provided as $d_{10}$, $d_{20}$ and $d_{40}$ for the second digit and as $d_1$, $d_2$, $d_3$ and $d_4$ for the first digit (suffixes being named according to the "1, 2, 4 and 8" code). Forbidden codes for the forbidden channels are also incorporated in the code converter 5. When a forbidden level signal is given to the comparison gate circuit 1, it is compared therein with the output level of the phase detector 4 thereby to judge whether or not transmission should be made. In other words, both of the above-mentioned output signals are at the level H, the comparison gate circuit 1 permits input to an amplifier $AMP_{TX}$ of the transmission stage; and when either of the above signals is at the level L, the circuit 1 operates so as to prohibit transmission.

The following description is concerned with the case where No. 1 to No. 50 channels may be used and where channels No. 51 and over are forbidden. In this case, the change-over switch uses numbers 0 to 5 for the second digit and numbers 0 to 9 for the first digit; therefore the above code converter may be so made that it generates forbidden level outputs when the numerical combinations for each dial of each digit take 5 and 1, 5 and 2, . . . , 5 and 9, and 0 and 0. Furthermore, when any of the channels No. 1 to No. 50 are forbidden, the code converter 5 may be so made as a matter of course that it outputs signals of the forbidden level and supplies them to the comparison gate circuit 1.

The code converter 5, phase detector 4, variable frequency divider 3 and fixed frequency divider 9 are formed into a large-scale integrated semiconductor circuit very small in size and light in weight; therefore it is very easy to incorporate into the above integrated circuit such components as leads for feeding forbidden level signals to the code converter 5 and as the comparison gate circuit 1.

As is apparent from the foregoing description, the present invention can completely prevent transmission of disturbance or jamming waves even when channel selection is made by a channel-selecting switch provided for each digit, since forbidden codes for forbidden channels are generated and compared with the output level of the fixed frequency divider 9 thereby to judge as to whether or not transmission to the following stage should be allowed.

Next, the second embodiment of the present invention will be hereinafter described in conjunction with FIGS. 1, 3, 4 and 5.

Generally the transmitter-receiver apparatus such as transceivers adopt a frequency synthesizer of the phase locked loop (PLL) type. In the PLL system, the digital circuits are mainly formed into an integrated circuit. Channel selection is usually made by selectively controlling the variable frequency divider in the PLL system by switching of a change-over switch such as an electronic channel-selection switch or rotary switch; on the other hand, transmission is made by operating the press-to-talk switch contained in the hand microphone connected to the transmitter-receiver proper through leads. Therefore, it is an usual practice to perform channel selection during the state of reception. If channel selection is made during the state of transmission intentionally or inadvertently, however, the following troubles tend to occur. For example, if the press-to-talk switch is kept depressed, disturbance or jamming waves are liable to generate in any communication system; or if, during the switching operation of the channel selector switch, that is, during the period when the slider is moving between two adjacent contacts, the two adjacent contacts happen to be short-circuited by the slider, wrong channel-selection codes will tend to be supplied to the variable frequency divider. The above-mentioned troubles due to the wrong operations of the channel selector switch may be prevented by providing the variable frequency divider with a code converter having forbidden bits. At present, however, it is disadvantageous in terms of economy to incorporate the code converter into an integrated circuit.

In order to eliminate transmission of disturbance or jamming waves due to wrong operations or actions, therefore, the present invention is intended to suspend transmission at least during the channel selection period. Accordingly, the present invention takes notice of the change-over contact position of the selector switch and the phase detector which continuously generate pulses during the time when the PLL system is unlocked, and thereby is intended to preferentially use an inhibiting signal having a longer transmission period from among those separately generated.

As shown in FIG. 3, the PLL system is composed of a fixed frequency divider DIV to which is applied a reference frequency outputted from a reference oscillator OSC provided with a quartz oscillator X, a variable frequency divider 3 (P.DIV) to which channel-selection signals are inputted from the selector switch $SW_A$, a phase detector 4 (P/D) for comparing the divided-frequency outputs of the above-mentioned fixed and variable frequency dividers, a low-pass filter LPF and a voltage-controlled oscillator VCO through which the output of the phase detector 4 (P/D) is fed back to the variable frequency divider 3 (P.DIV). A switch $SW_B$ identified as a channel-selection code generator 6 is provided so as to interlock with the selector switch $SW_A$, being provided with contacts disposed at angular positions coresponding to the positions midway between the adjacent change-over contacts of the selector switch $SW_A$. The above contacts of the switch $SW_B$ is connected to the base terminal of an emitter-grounded transistor $Q_2$ the collector of which is connected to a power supply $P_S$ through a resistance $R_1$. The above phase detector 4 (P/D) is provided with a driving input terminal $T_{DD}$ and a lock-detecting terminal $T_{LD}$. The terminal $T_{LD}$ is connected through a backward diode D to a connection between the base of the transistor $Q_1$, a grounded $C_2$, the transistor $Q_2$ and the collector resistance $R_1$. The collector of the transistor $Q_1$ is connected to the power supply $P_S$, and the emitter thereof is connected to the amplifier and mixer of the transmission stage, or to the bias circuit of the crystal-controlled oscillation circuit, or to a power supply so as to supply thereto inhibiting signals for suspension of transmission. As an example of the inhibiting-signal generating circuit mentioned above, FIG. 4(a) shows a circuit in which the switch $SW_B$ for sending out the inhibiting signals is made electrically independent of the selector switch $SW_A$, and thereby it is directly connected to the backward diode D and transistor $Q_1$ eliminating the emitter-grounded transistor $Q_2$; and FIG. 4(b) is a circuit in which the amplifying transistor $Q_1$ of the transmitting stage is cut off by application of a reverse bias to the emitter thereof or application of a forward bias by connecting the switch $SW_B$ directly to the base thereof.

In the above circuit configuration, the switch $SW_B$ interlocked with the selector switch $SW_A$ generates pulses according to the speed at which the switch $SW_A$ changes and passes its contacts, and thereby makes the transistor $Q_2$ shown in FIG. 3 conduct and cuts off the transistor $Q_1$. The circuits shown in FIGS. 4(a) and 4(b) also use the transistor $Q_1$ for controlling the bias of, for instance, the amplifier of the transmitting stage. The voltage-controlled oscillator VCO in the PLL system is not locked during the operation of channel selection, and it is also not locked until channel selection is completed, that is, the selector switch has been set to a particular contact.

Figure 5:
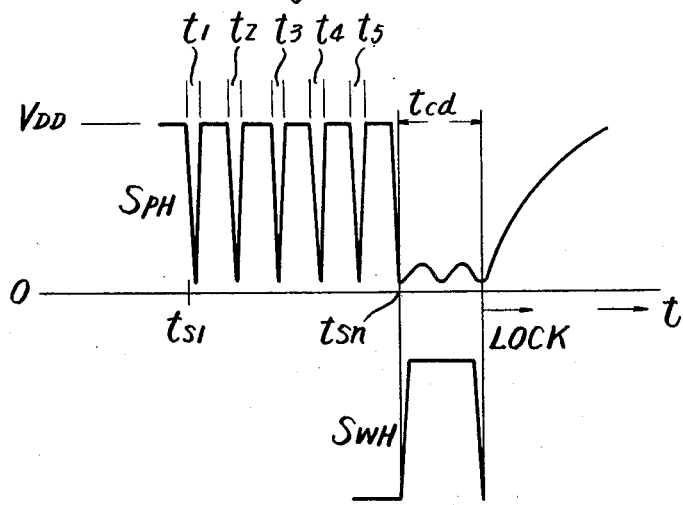
FIG. 5 is a wave-form graph of an inhibiting signal plotted with respect to time.

The following description with reference to FIG. 5 is concerned with the waveform of pulses generated from the lock-detecting terminal $T_{LD}$ of the phase detector 4 and that of inhibiting signals $S_{WH}$ generated from the switch $SW_B$, and with their relationship with time. Voltage $V_{DD}$ is applied to the driving input terminal $T_{DD}$ of the phase detector 4, which sends out frequency-difference signals to the voltage-controlled oscillator VCO and, in addition, gives its lock-detecting terminal $T_{LD}$ pulses equivalent to sampling frequencies obtained from phase comparison between the period from $T_{S1}$ to $T_{Sn}$ corresponding to the period when the PLL system is not locked, that is, when channel selection is being performed by the selector switch $SW_A$. The peak value of the pulse is maintained by the charge of the capacitor $C_2$. The pulse falls by discharge of the capacitor $C_2$ during the periods $t_1, t_2, \ldots t_5$. In order to minimize the pulse fall period, the values of capacitors $C_1$ and $C_2$ and resistance $R_1$ are selected for a small time-constant; and a low power impulse is shaped so as to improve the duty ratio to obtain such a waveform as appearing after the time $t_{sn}$. Since the output that can be taken out is inherently small, it is amplified by a transistor. Thus the backward diode D takes out the negative (−) components, i.e., the voltage-time integrated values for the periods $t_1, t_2, t_3 \ldots$ during the period $t_{cd}$ and applies them to the transistor $Q_1$. During the channel-selection operation, on the other hand, the switch $SW_B$ generates an inhibiting signal with a waveform $S_{WH}$ each time when the selector switch contacts are brought into the switching process, while interlocking with the selector switch $SW_A$. Therefore, if the selector switch $SW_A$ is kept operating even at the time $t_{sn}$, the switch $SW_B$ is in the priority state since it is generating the inhibiting signals; thus the waveform $S_{PH}$ during the period $t_{cd}$ before the PLL system is locked is changed due to charge and discharge caused by the resistance $R_1$ and capacitor $C_2$ until the switch $SW_B$ stops operation and thereby the PLL system is locked. In this manner, the waveform $S_{PH}$ changes according to the time constant of the whole circuit as shown in FIG. 5. The priority state signifies that the locking time is controlled by the longer period out of the periods of the waveforms $S_{PH}$ and $S_{WH}$. The period $t_{cd}$ changes proportionally to the operation period of the switch $SW_B$, that is, the operation speed of the switch $SW_A$.

According to the present invention as mentioned above, the inhibiting-signal-generating switch is provided interlocking with the selector switch and is disposed between the adjacent change-over contacts of the selector switch; therefore the present invention can eliminate troubles such as transmission of disturbance or jamming waves due to wrong operations or actions of the press-to-talk switch or selector switch and in addition can provide a simple inhibiting-signal-generating circuit by utilizing the signal given to the lock-detecting terminal of the phase detector.

Next, the third embodiment of the present invention will be described with reference to FIGS. 1, 6, 7 and 8.

When the receiving carrier frequency is swept by the intermediate frequency and thereby the transmitting frequency is synthesized by the PLL system, the automatic frequency control function of the PLL system is performed with high accuracy. Under the condition, however, where incessant shocks such as mechanical vibrations are imposed as in the case of a vehicle-mounted transmitter-receiver, shifts tend to occur to the frequency and phase of the output of the voltage-controlled oscillator; therefore, if the PLL system has an excessively high unlocking-detection sensitivity, troubles such as interruption of transmitting voices will occur because of the transmission-suspending function induced by the detecting action each time when shocks are applied. Therefore, it is necessary to properly select the sensitivity for detecting the shifts of the frequency and phase due to vibrations or the like, after locking is performed in the range of the transmitting carrier frequency band. On the other hand, it is desirable that the unlocking-detecting sensitivity should be high in a transient period when the system is switched from reception to transmission to shift up the frequency. As mentioned above, the unlocking-detecting sensitivity for vibrations or the like is preferably low. Accordingly, it becomes necessary to perform the follow-up control of the PLL system satisfying these two different unlocking-detecting sensitivities.

In order to eliminate the above-mentioned difficulties, the third embodiment of the present invention has the following features:

Synchronously with the reception-to-transmission switching operation conducted by depressing a press-to-talk switch, a variable frequency divider is adapted to change the number of frequency division steps through a usual shift-circuit for channel selection; a pulse-generating circuit interlocked with depressing of the press-to-talk switch is adapted to supply one shot pulse to a gate circuit; a phase detector in the PLL system gives the above-mentioned gate circuit the unlocking-detecting pulses with proper time delay; and the function of the transmitting stage is temporarily suspended by an integral synthesized pulse of the above two kinds of pulses.

Figure 6:
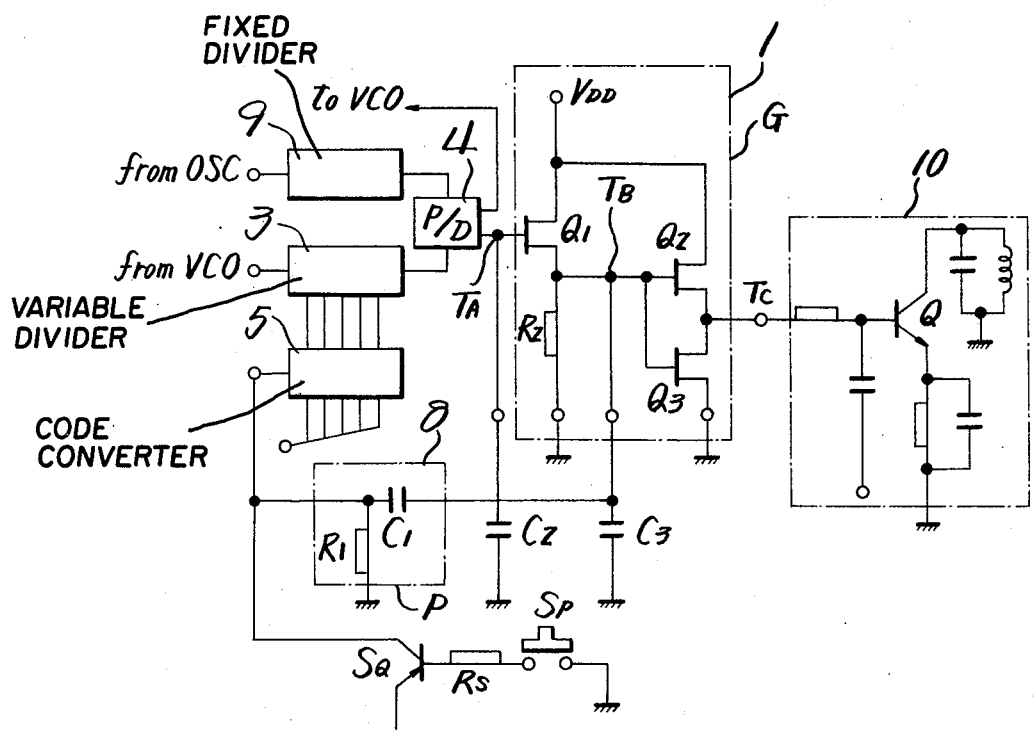
FIG. 6 is a circuit diagram of the third embodiment of the present invention.
Figure 7:
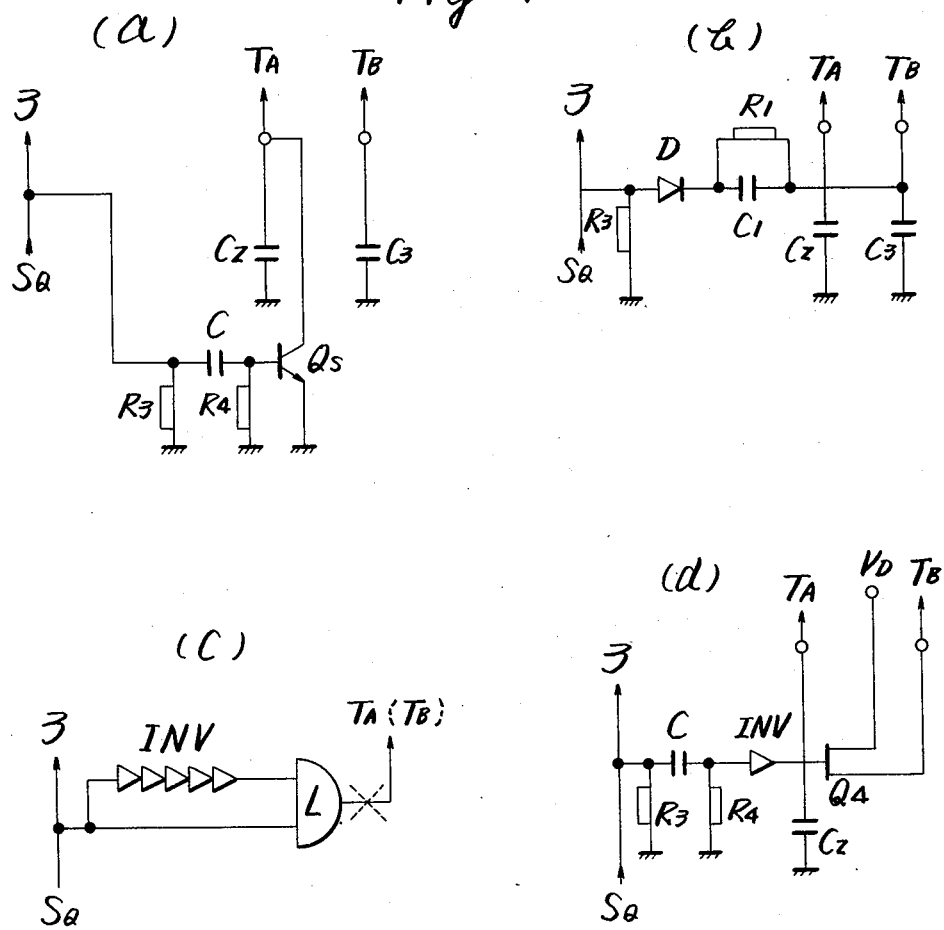
FIGS. 7(a) to 7(d) are examples of the circuit of the pulse-generating means.

In FIG. 6, the reference numeral 9 designated a fixed frequency divider which receives a reference frequency from a reference oscillator OSC, its divided-frequency output being applied to a phase detector 4 (P/D). Reference numeral 3 designates a variable frequency divider which changes its divided-frequency output according to the command signal of a code converter 5 generated by the switching operation of a channel selector switch and to which the output frequency of a voltage-controlled oscillator VCO is inputted. The divided-frequency output of the variable frequency divider 3 is supplied to the above phase detector 4 where it is compared with the output of the fixed frequency divider, the output of the phase detector 4 being fed back to the voltage-controlled oscillator as sum and difference signals. Thus the so-called phase locked loop (PLL) is formed. A reception-to-transmission switching command signal is applied to the code converter 5 through the collector of a transistor $S_Q$ which is made to conduct by depressing of a press-to-talk switch 7 ($S_P$). In addition, another output terminal of the phase detector 4 is connected to the input terminal $T_A$ of a comparison gate circuit 1 (G), and the output terminal $T_C$ or unlocking-detecting terminal of the comparison gate circuit 1 is connected to the section for suspending the operation of the transmitting stage 10. In the above comparison gate circuit 1, its terminal is the gate terminal $T_A$ of a switching transistor $Q_1$ to the drain terminal of which a driving power supply $V_{DD}$ is applied. The source terminal $T_B$ of the transistor $Q_1$ is connected to the common gate terminal of inverter transistors $Q_2$ and $Q_3$ whose source terminals are connected in parallel. A capacitor $C_2$, as a delay element for controlling the unlocking-detecting sensitivity, is provided between the ground and the gate terminal $T_A$ of the switching transistor $Q_1$; and a capacitor $C_3$ is provided between the ground and the source terminal $T_B$ of the transistor $Q_1$, which integrates a one shot pulse outputted from a pulse generating means 8 (P) and a delayed pulse outputted from the phase detector 4 in order to produce a pulse wave shaped in waveform. The output terminal of the pulse-generating means 8 is connected to the output terminal $T_B$ of the switching transistor $Q_1$. If the switching speed of the channel selector switch is high and the time constant of the circuit connected to the detecting output terminal of the phase detector 4 is large, the first pulse wave becomes rather flat and is generated in a delayed phase from the phase detector 4. Therefore, the pulse-generating means 8 for generating a one shot pulse synchronously with depressing of the press-to-talk switch 7 prior to the above-mentioned delayed pulse outputted from the phase detector 4 may be formed as shown in FIGS. 7(a) to 7(d). FIG. 7(a) shows an example of a NAND circuit used as a logic element which receives as an input the output of multi-stage inverters the number of which is required for creating the width of one pulse; if an additional inverter is inserted at the portion marked with a dotted crisscross, the phase of the outputted pulse will be inverted. This fact shows that the output terminal of the pulse-generating means 8 may be connected either to the input terminal $T_A$ of the comparison gate circuit 1 or to the source terminal $T_B$ of the switching transistor $Q_1$, and is one of the favorable features enabling large-scale integration of the circuit of the present invention including the main part of the PLL system. In FIG. 7(b), a resistor $R_1$ very high in resistance is provided in parallel with the capacitor $C_1$ to form a closed circuit for discharge, so that the impedance of the pulse-generating means 8 may become higher than that of the comparison gate circuit 1; a diode D is connected in series to the capacitor $C_1$. In the above examples, negative and positive pulses appear at the terminal $T_A$ and terminal $T_B$, respectively.

Figure 8:
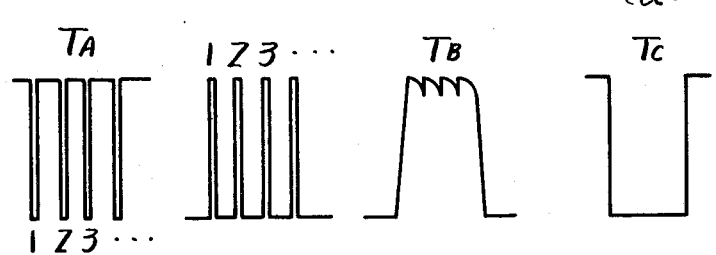
FIGS. 8(a) to 8(d) are wave-form graphs for various parts of the third embodiment shown in FIG. 6.

The following description with reference to FIG. 8 is concerned with the pulse waveforms appearing at various parts of the circuit of the present invention. FIG. 8(a) shows a negative pulse wave formed by delaying, using the capacitor $C_2$, an unlocking signal outputted from the phase detector 4 and appearing at the input terminal of the comparison gate circuit 1. FIG. 8 (b) shows inverted positive pulses passed through the switching transistor $Q_1$. FIG. 8 (c) shows a serrated wave appearing at the terminal $T_B$ and produced by combining a one shot pulse outputted from the pulse-generating means 8 with pulses outputted from the phase detector and integrating them by means of the capacitor $C_3$. FIG. 8 (d) shows a negative integrated wave appearing at the unlocking-detecting terminal $T_C$, which may be used for cutting off the bias of the transmitting stage 10 or for breaking the power supply thereby to suspend transmission.

According to the present invention as mentioned above, the unlocking-detecting signal outputted from the phase detector of the phase locked loop type frrequency control system is delayed, and a one shot pulse is generated synchronously with depressing of the press-to-talk switch prior to the above unlocking-detecting signal; therefore the present invention can perform unlocking-detection with high sensitivity during the reception-to-transmission switching period to prevent transmission of disturbance or jamming waves; and even if the output frequency and phase of the voltage-controlled oscillator are shifted due to shocks such as vibrations after locking-up, these shifts can be automatically controlled with proper unlocking-detecting sensitivity thereby to completely prevent transmission of disturbance or jamming waves.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. In a transceiver having transmitting and receiving stages, a transmission and reception control circuit comprising:
   a voltage-controlled oscillator;
   a variable frequency divider connected to the voltage-controlled oscillator for providing a variable output frequency;
   changing means for changing the output frequency of the variable frequency divider;
   a fixed frequency divider;
   means for connecting the fixed frequency divider to a reference frequency source;
   a phase detector connected between the frequency dividers and the voltage-controlled oscillator for comparing the output frequencies of the frequency dividers to produce an output to automatically control the voltage-controlled oscillator; and
   gate means responsive to the output of the phase detector and an output of the changing means indicative of a prohibited channel for inhibiting the operation of the transmitting and receiving stages.

2. The transmission reception control circuit recited in claim 1 wherein:
   the changing means comprises a code converter connected to the variable frequency divider and to the gate means.

3. The transmission and reception control circuit recited in claim 1 wherein:
   the changing means comprises a channel-selection code generator connected to the variable frequency divider and to the gate means.

4. The transmission and reception control circuit recited in claim 1 wherein:
   the changing means comprises a press-to-talk switch connected to the variable frequency divider and to the gate means.

5. The transmission and reception control circuit recited in claim 1 wherein the changing means comprises:
   a code converter connected to the variable frequency divider and to the gate means; and
   a channel-selection code generator connected to the code converter and to the gate means.

6. The transmission and reception control circuit recited in claim 1 wherein the changing means comprises:
   a code converter connected to the variable frequency divider and to the gate means; and
   a press-to-talk switch connected to the code converter and to the gate means.

7. The transmission and reception control circuit recited in claim 1 wherein the changing means comprises:
   a channel-selection code generator connected to the variable frequency divider and to the gate means; and
   a press-to-talk switch connected to the code generator and to the gate means.

8. The transmission and reception control circuit recited in claim 1 wherein the changing means comprises:
   a code converter connected to the variable frequency divider and to the gate means; and
   a channel-selection code generator connected to the code converter and to the gate means; and
   a press-to-talk switch connected to the code converter and to the gate means.

* * * * *